(12) United States Patent  (10) Patent No.: US 6,623,051 B2
Bonora  (45) Date of Patent: Sep. 23, 2003

(54) LATERALLY FLOATING LATCH HUB ASSEMBLY

(75) Inventor: Anthony C. Bonora, Woodside, CA (US)

(73) Assignee: Entegris, Inc., Chaska, MN (US)

( * ) Notice: Subject to any disclaimer, the term of this patent is extended or adjusted under 35 U.S.C. 154(b) by 0 days.

(21) Appl. No.: 10/022,309

(22) Filed: Dec. 13, 2001

(65) Prior Publication Data

US 2002/0149209 A1 Oct. 17, 2002

Related U.S. Application Data

(60) Provisional application No. 60/255,625, filed on Dec. 13, 2000.

(51) Int. Cl.$^7$ .............................................. E05B 39/02
(52) U.S. Cl. ............................... 292/330; 292/DIG. 62; 70/379 R
(58) Field of Search ...................... 292/330, DIG. 62; 414/416; 206/710; 70/DIG. 42, 379 R, 379 A, 300

(56) References Cited

U.S. PATENT DOCUMENTS

| | | | |
|---|---|---|---|
| 248,086 A | * 10/1881 | Cassidy ...................... 215/272 |
| 368,784 A | 8/1887 | Rippe |
| 956,759 A | * 5/1910 | Clouse ......................... 292/37 |
| 1,019,678 A | * 3/1912 | Mason ......................... 292/37 |
| 1,269,572 A | * 6/1918 | Allenbaugh .................. 292/37 |
| 1,284,491 A | * 11/1918 | Thiede ..................... 70/379 R |
| 1,495,820 A | * 5/1924 | Tierney ....................... 70/108 |
| 1,908,980 A | * 5/1933 | Heyel .......................... 70/120 |
| 1,909,697 A | * 5/1933 | MacBeth et al. ............. 292/36 |
| 2,920,474 A | 1/1960 | Johns |
| 2,947,160 A | 8/1960 | Wolters |
| 3,276,835 A | * 10/1966 | Hall ............................ 312/333 |
| 4,114,933 A | * 9/1978 | Jankelewitz et al. .......... 292/37 |
| 4,288,944 A | * 9/1981 | Donovan ..................... 49/395 |
| 4,523,407 A | * 6/1985 | Miller ......................... 49/465 |
| 4,532,970 A | 8/1985 | Tullis et al. |
| 4,534,192 A | * 8/1985 | Harshbarger et al. ......... 70/118 |
| 4,534,389 A | 8/1985 | Tullis |
| 4,995,430 A | * 2/1991 | Bonora et al. ................ 141/98 |
| 5,149,152 A | * 9/1992 | Lanius ......................... 292/37 |
| 5,289,655 A | * 3/1994 | Marmora et al. ............. 49/141 |
| 5,482,161 A | * 1/1996 | Williams et al. ............. 206/711 |
| 5,570,913 A | * 11/1996 | Puric ........................... 292/36 |
| 5,570,987 A | * 11/1996 | McKenna .................... 414/416 |
| 5,711,427 A | * 1/1998 | Nyseth ........................ 206/710 |
| 5,740,845 A | * 4/1998 | Bonora et al. ............... 141/292 |
| 5,915,562 A | * 6/1999 | Nyseth et al. ............... 206/711 |
| 5,957,292 A | * 9/1999 | Mikkelsen et al. .......... 206/710 |
| 6,000,732 A | * 12/1999 | Scheler et al. ................ 292/68 |
| 6,098,809 A | * 8/2000 | Okada et al. ................ 206/711 |
| 6,105,782 A | * 8/2000 | Fujimori et al. ............. 206/710 |
| 6,186,331 B1 | * 2/2001 | Kinpara et al. .............. 206/711 |
| 6,281,516 B1 | * 8/2001 | Bacchi et al. ........... 250/559.29 |
| 6,340,933 B1 | * 1/2002 | Chen et al. .................. 340/687 |
| 6,350,418 B1 | * 2/2002 | Venderpool et al. ......... 422/297 |
| 6,398,475 B1 | * 6/2002 | Ishikawa ..................... 414/217 |
| 6,419,438 B1 | * 7/2002 | Rosenquist .................. 414/217 |
| 6,430,877 B1 | * 8/2002 | Rosenquist et al. ........... 49/394 |
| 6,536,592 B1 | * 3/2003 | Chang et al. ............. 206/459.1 |

OTHER PUBLICATIONS

U.S. patent application Ser. No. 10/020,761, Bonora, filed Dec. 13, 2001.
Mihir Parikh, Ulirich Kaempf—SMIF: A Technology for Wafer Cassette Transfer in VLSI Manufacturing; Solid State Technology; Jul, 1984; p. 111–115.

* cited by examiner

Primary Examiner—Robert J. Sandy
Assistant Examiner—Carlos Lugo
(74) Attorney, Agent, or Firm—Patterson, Thuente, Skaar & Christensen, P.A.

(57) ABSTRACT

A laterally floating latch hub assembly includes a latch key receptor translatably mounted within a rotatable latch actuation cam. Latch keys within a port door are received within the latch key receptor, which is capable of translating laterally to ensure a proper fit of the latch key within the receptor. Once received within the receptor, torque from the latch keys is transmitted to the latch actuation cam via the latch key receptor.

13 Claims, 9 Drawing Sheets

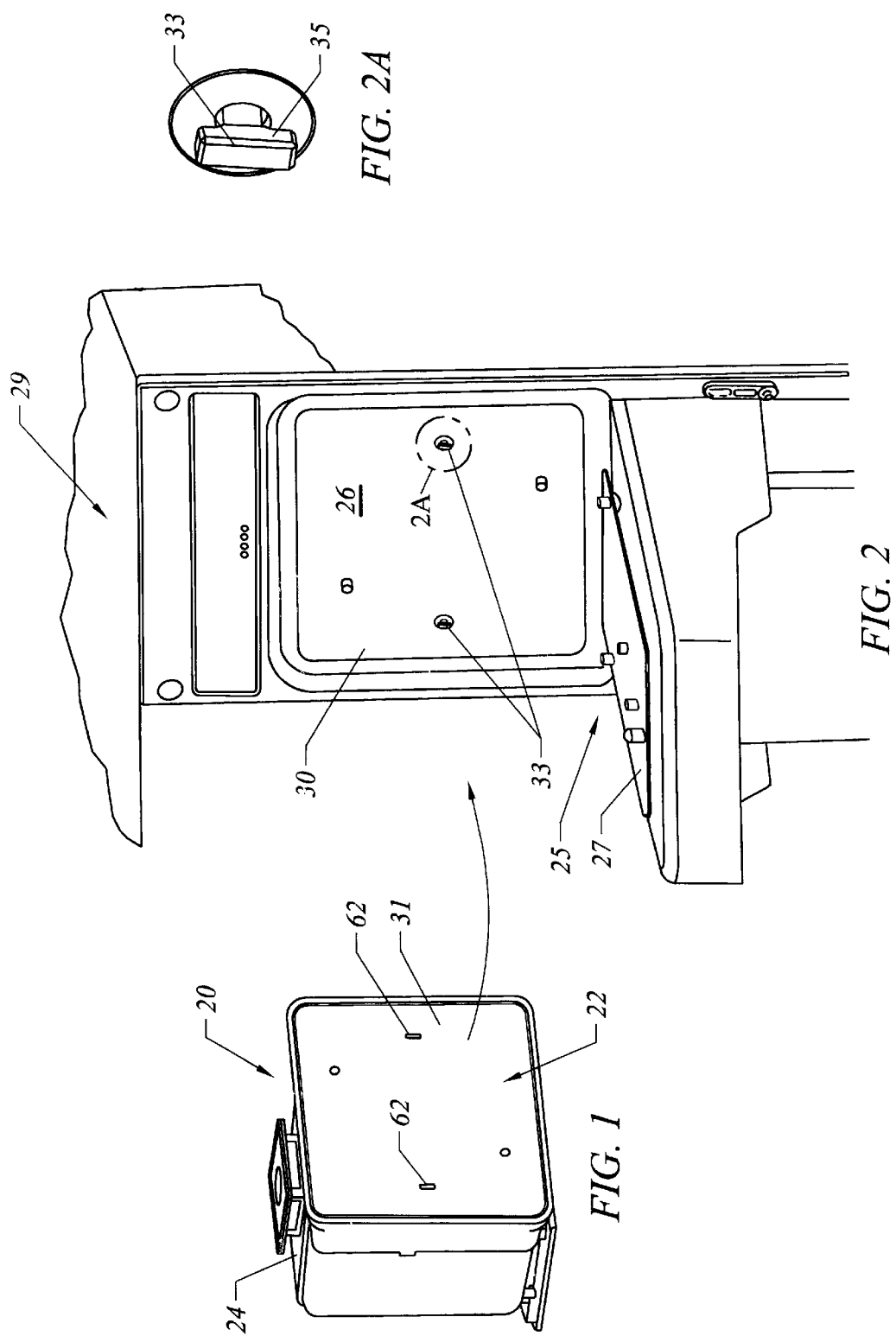

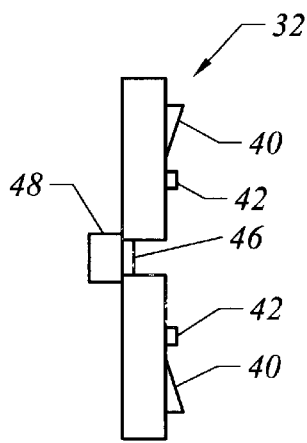
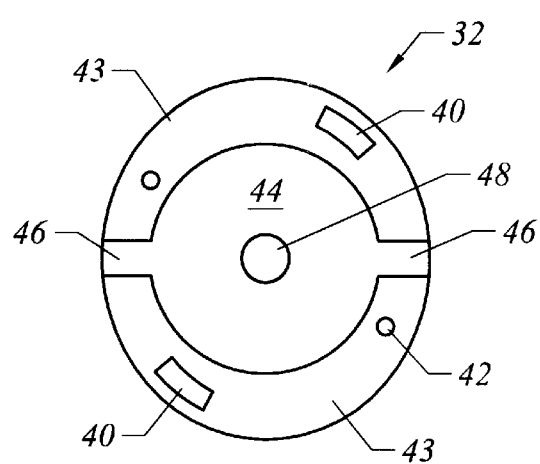
*FIG. 5A*  *FIG. 5B*
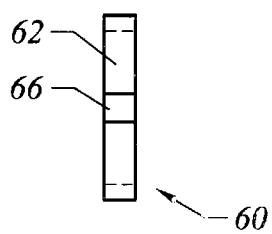
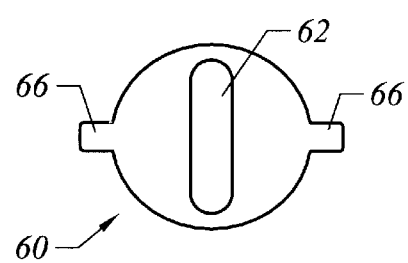
*FIG. 6A*  *FIG. 6B*
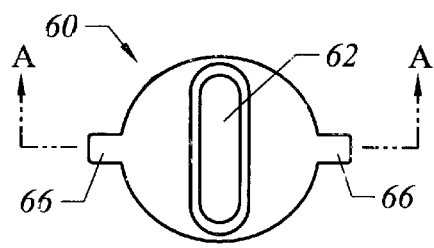
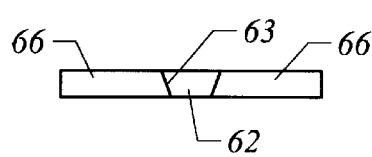
*FIG. 6C*  *FIG. 6D*

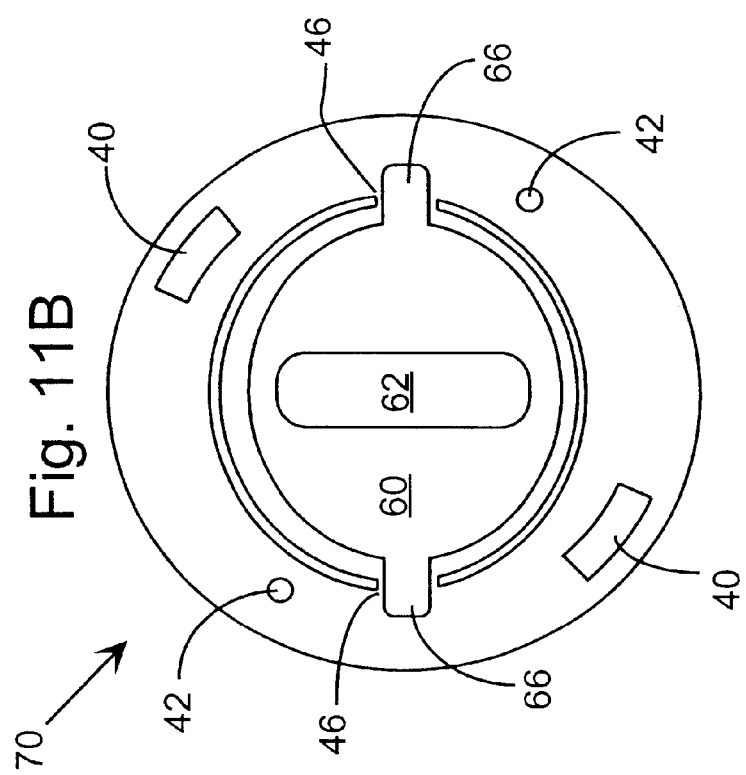
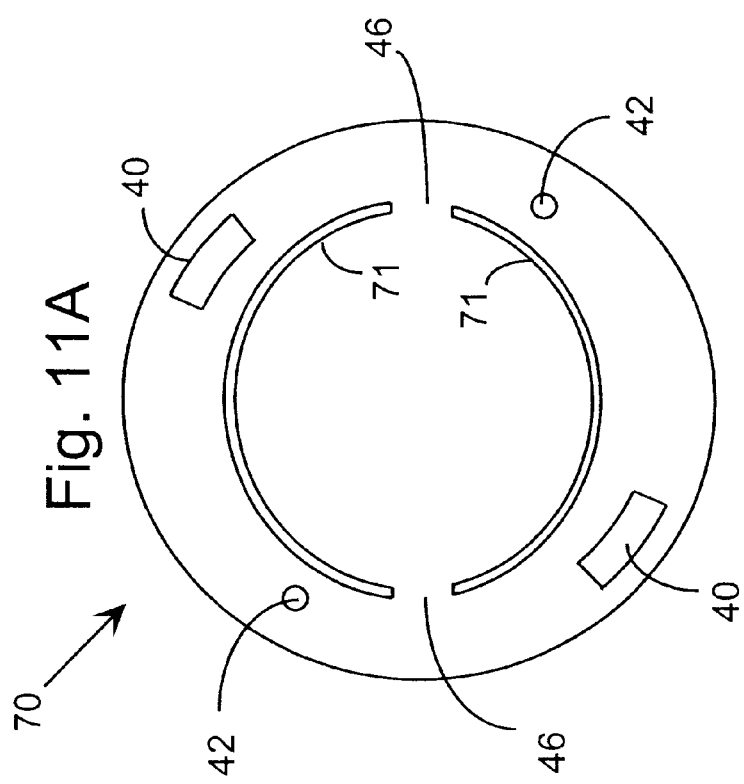

LATERALLY FLOATING LATCH HUB ASSEMBLY

CLAIM OF PRIORITY

This application claims the benefit of U.S. provisional application Serial No. 60/255,625, filed Dec. 13, 2000, the disclosure of which is incorporated herein by reference.

BACKGROUND OF THE INVENTION

1. Field of the Invention

The present invention relates to front opening unified pods, or FOUPs, and in particular to a laterally floating latch hub assembly provided in the FOUP door or port door to increase the tolerance of the latch assembly for mating with the driven latch keys and to minimize FOUP error at port.

2. Description of Related Art

A SMIF (Standardized Mechanical Interface) system proposed by the Hewlett-Packard Company is disclosed is U.S. Pat. Nos. 4,532,970 and 4,534,389. The purpose of a SMIF system is to reduce particle fluxes into semiconductor wafers during storage and transport of the wafers through the semiconductor fabrication process. This purpose is accomplished, in part, by mechanically ensuring that during storage and transport, the gaseous media (such as air or nitrogen) surrounding the wafers is essentially stationary relative to the wafers, and by ensuring that particles from the ambient environment do not enter the immediate wafer environment.

A SMIF system has three main components: (1) minimum volume, sealed pods used for storing and transporting wafers and/or wafer cassettes; (2) an input/output (I/O) minienvironment located on a semiconductor processing tool to provide a miniature clean space (upon being filled with clean air) in which exposed wafers and/or wafer cassettes may be transferred to and from the interior of the processing tool; and (3) an interface for transferring the wafers and/or wafer cassettes between the SMIF pods and the SMIF minienvironment without exposure of the wafers or cassettes to particulates. Further details of one proposed SMIF system are described in the paper entitled "SMIF: A TECHNOLOGY FOR WAFER CASSETTE TRANSFER IN VLSI MANUFACTURING," by Mihir Parikh and Ulrich Kaempf, Solid State Technology, July 1984, pp. 111–115.

Systems of the above type are concerned with particle sizes which range from below 0.02 microns ($\mu$m) to above 200 $\mu$m. Particles with these sizes can be very damaging in semiconductor processing because of the small geometries employed in fabricating semiconductor devices. Typical advanced semiconductor processes today employ geometries which are one-half $\mu$m and under. Unwanted contamination particles which have geometries measuring greater than 0.1 $\mu$m substantially interfere with 1 $\mu$m geometry semiconductor devices. The trend, of course, is to have smaller and smaller semiconductor processing geometries which today in research and development labs approach 0.1 $\mu$m and below. In the future, geometries will become smaller and smaller and hence smaller and smaller contamination particles and molecular contaminants become of interest.

FOUPs (Front Opening Unified Ports) are in general comprised of a vertically oriented FOUP door which mates with a FOUP shell to provide a sealed, ultraclean interior environment in which wafers may be stored and transferred. The wafers are supported in either a cassette mounted to the interior of the shell, or to shelves mounted to the interior of the shell.

In order to transfer wafers between a FOUP and a process tool within a wafer fab, a FOUP is typically loaded either manually or automatedly onto a load port on a front of the tool so that the pod door lies adjacent the port door of the process tool. The port door includes a pair of rotatable latch keys, which keys are capable of mating within respective slots in the FOUP door to accomplish two objectives. Once the doors are positioned adjacent each other and the keys are located in the slots, rotation of the keys actuate a latch assembly within the FOUP door to decouple the FOUP door from the FOUP. Details relating to such a latch assembly within the FOUP door are disclosed for example in U.S. Pat. No. 4,995,430, entitled "Sealable Transportable Container Having Improved Latch Mechanism", to Bonora et al., which patent is owned by the assignee of the present application. Second, rotation of the latch keys within the slots couples the FOUP door to the port door, so the doors may thereafter be moved together out of and away from the port to allow wafer transfer between the FOUP and the process tool. Upon completion of wafer processing, the port door returns the FOUP door to the FOUP. At this point, rotation of the latch keys in the opposite direction decouples the port and FOUP doors and again latches the FOUP door to the FOUP.

It is necessary to precisely and repeatably control the position of the front surface of the FOUP door on the load port to ensure a clean mating of the FOUP door to the port door. In order to establish the desired position, conventional load port assembly systems include kinematic pins on a horizontal support surface, which pins mate within slots on the bottom of the FOUP to support the FOUP in a fixed and repeatable position. However, a problem with conventional front opening load port assemblies is that, while the horizontal surface of the FOUP seated on the kinematic pins is precisely positioned, the actual position of the front surface of the FOUP door is not precisely controlled and may vary as much as approximately 25 mils to either side. Sources of this variance include warping, improper construction and tolerances of the FOUP, improper seating of the FOUP door in the FOUP, and tolerances in the location of the kinematic pins.

This variance between the expected and actual relative positions of the FOUP and port doors is significant because the maximum tolerance for the port door latch keys to fit properly in the FOUL door slots is approximately ±5 mils. A greater variance than that may result in contact between the latch keys and the walls defining the FOUP slots, thereby generating particulates. Where the variance is significant, it can also cause a "FOUP error at port", where the load port controller recognizes an error and stops the process. The load port would then sit idle until a technician can attend to the problem. As there can be several hundred load ports in a wafer fab, each susceptible to FOUP error at port due to misalignment of the latch keys with the FOUP slots, this problem can significantly impact production throughput and has become a significant concern to wafer manufacturers. Prior art attempts to solve this problem include beveling both the latch keys and slots, but this solution has proven only partially effective in alleviating the problem.

SUMMARY OF THE INVENTION

It is therefore an advantage of the present invention to provide a positionally tolerant system whereby a latch key can properly engage within a FOUP slot even upon an initial misalignment.

It is a further advantage of the present invention to provide a laterally floating latch hub assembly which maybe easily incorporated into existing latch assembly designs.

It is a further advantage of the present invention to provide a laterally floating latch hub assembly which can effectively transmit torque from the latch keys to the latch assembly.

It is a further advantage of the present invention to provide a laterally floating latch hub assembly which can be incorporated into a FOUP door without changing the outer configuration or dimensions of the FOUP door or FOUP.

These and other advantages are provided by the present invention which in preferred embodiments relates to a laterally floating latch hub assembly. In preferred embodiments, the laterally floating latch hub assembly includes a latch key receptor translatably mounted within a rotatable latch actuation cam. Upon advancing a FOUP to a load port assembly, the latch keys within the port door are received within the latch key receptor, which is capable of translating laterally to ensure a proper fit of the latch key within the receptor. Once received within the receptor, torque from the latch keys is transmitted to the latch actuation cam via the latch key receptor. It is additionally or alternatively contemplated that the latch keys in the port door be translatably mounted to a driven hub within the port door so that the latch keys themselves may shift laterally to ensure a proper fit of the keys within the latch assembly in the FOUP.

BRIEF DESCRIPTION OF THE DRAWINGS

The invention will now be described with reference to the drawings in which:

FIG. 1 is a rear perspective view of a FOUP according to the present invention;

FIG. 2 is a front perspective view of a load port assembly for receiving a FOUP according to the present invention;

FIG. 2A is an enlarged perspective view of Section 2A shown in FIG. 2, illustrating a latch key for being received within a laterally floating latch hub assembly according to the present invention.

FIG. 5A is an enlarged side view of the latch actuation cam according to the present invention;

FIG. 5B is a front view of a latch actuation cam according to the present invention;

FIG. 6A is a side view of a latch key receptor according to the present invention;

FIG. 6B is a front view of a latch key receptor according to the present invention;

FIG. 6C is a front view of a second embodiment of a latch key receptor that includes a beveled edge;

FIG. 6D is a cut-away view along view line A—A shown in FIG. 6C, illustrating one aspect of the latch key with a beveled edge;

FIG. 11A is a front view of an alternative embodiment of a latch actuation cam according to the present invention;

FIG. 11B is a front view showing a latch key receptor mounted in a latch actuation cam according to FIG. 11A;

DETAILED DESCRIPTION

Figure 3:
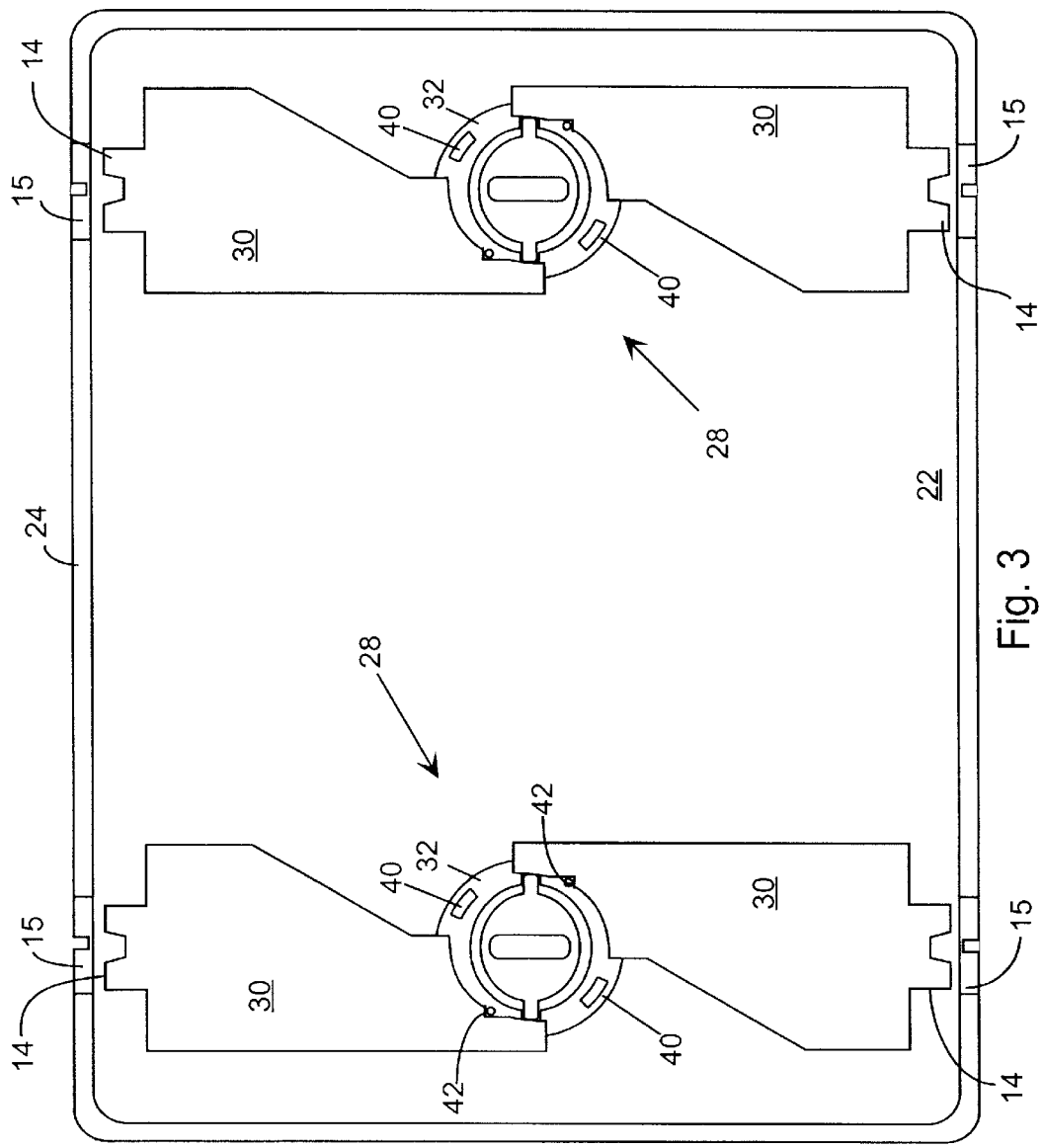
FIG. 3 is a front view of an interior of a FOUP door and shell showing a pair of latch assemblies including laterally floating latch hub assemblies according to the present invention.

The present invention will now be described with reference to FIGS. 1–15 which in preferred embodiments relate to a FOUP door including a laterally floating latch hub assembly. In a preferred embodiment, the laterally floating latch hub assembly may be incorporated into an otherwise conventional latch assembly for coupling and uncoupling a FOUP door within a FOUP.

Referring now to FIG. 1, there is shown a perspective view of a 300 mm FOUP 20 including a FOUP door 22 mating with a FOUP shell 24 to define a sealed environment for one or more workpieces located therein. (The rear of the FOUP door 22 would ordinarily be facing the port door as the FOUP is loaded on the port. It is shown otherwise in FIG. 1 for clarity.) While the FOUP 20 is illustrated as a 300 mm FOUP, the size and type of the container are not critical to the present invention. In order to transfer the workpieces between the FOUP 20 and the process tool 29 (FIG. 2), the FOUP is loaded onto a port 25 adjacent a port door 26 on a front of the process tool. The type of process carried out within tool 29 is not critical to the present invention, and may be any of various testing, monitoring and/or processing operations.

Referring now to FIGS. 1, 2 and 2A, the FOUP door includes a cover plate 31 which faces a front surface 30 of the port door 26. The door 26 includes a pair of latch keys 33 for being received within a corresponding pair of slots 62 of the laterally floating latch hub assembly as explained hereinafter. In order to latch the FOUP and port doors together, the FOUP door 22 is seated on a pod advance plate 27 which then advances the FOUP up to the port door so that the vertically oriented latch keys 33 are received within the vertically oriented slots 62.

FIG. 3 is a front view of a FOUP door 22 with cover plate 31 removed. The door 22 is seated within the FOUP shell 24, the edge of which is visible in FIG. 3 around the periphery of the FOUP door. Within FOUP door 22 are mounted a pair of latch assemblies each including a laterally floating latch hub assembly according to the present invention and a pair of latch plates 30. The latch plates 30 include fingers 14 at distal ends thereof provided to seat within slots 15 in the FOUP shell. Upon rotation of the laterally floating latch hub assembly 28 by the latch keys 33, the fingers 14 are driven into and out of engagement with slots 15 formed in the FOUP shell 24 to thereby couple and uncouple the FOUP door to and from the FOUP.

With the exception of the laterally floating features of hub assembly 28 according to the present invention, further details relating to the latch assemblies are disclosed in U.S. Pat. No. 4,995,430 entitled "Sealable Transportable Container Having Improved Latch Mechanism", to Bonora et al., which patent is assigned to the owner of the present invention, and which patent is incorporated by reference herein in its entirety. Although not critical to the present invention, the latch assemblies preferably have a two-stage operation. In a first stage of operation, pins 42 mounted to the laterally floating latch hub assembly 28 drive the latch plates laterally to extend the fingers 14 into the slots 15. Upon further rotation of the laterally floating latch hub assembly 28 during the second stage of operation, the latch plates 30 ride up ramps 40 on the assembly 28 so that the latch plates pivot in a direction into and out of the page with respect to the drawing of FIG. 3 and about an axis perpendicular to the direction of translation of the plates. The pivoting of the fingers 14 within slots 15 during the second stage of operation act to pull the FOUP door into a tight engagement with the FOUP shell to ensure a sealed environment within the FOUP.

Figure 4:
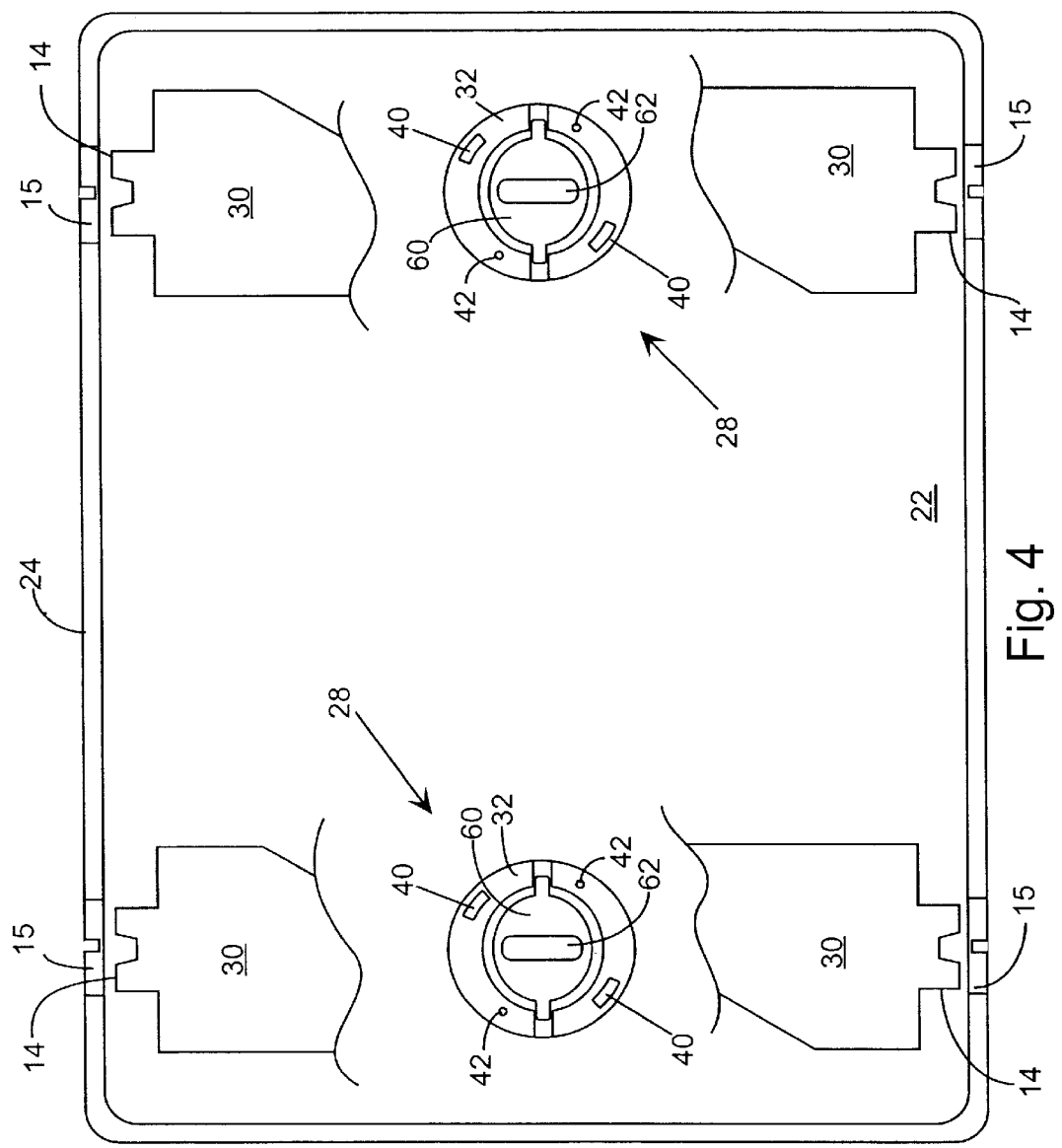
FIG. 4 is a front view of an interior of a FOUP door and shelf with the latch plates cut away to show the laterally floating latch hub assembly according to the present invention.

FIG. 4 is a front view of the interior of the FOUP with portions of the latch plates 30 cut away to show the detail of the two laterally floating latch hub assemblies 28 according to the present invention. The two latch hub assemblies 28 are identical to each other and reference hereinafter shall be to a single assembly 28 with an understanding that the following description applies to both assemblies 28. Referring now to FIG. 4 and the enlarged views of FIGS. 5A–10, the laterally floating latch hub assembly 28 in general comprises a latch key receptor 60 mounted for lateral translation within a latch actuation cam 32. In general, the latch key receptor moves laterally, or floats, within the latch actuation cam 32 to operate as an Oldham coupling to transfer torque from the latch keys 33 to the floating latch hub assembly 28, even where the latch hub assembly may not precisely align with the latch key.

As best seen in FIGS. 5A and 5B, one embodiment of the latch actuation cam 32 includes a pair of semicircular walls 43 which together define a recessed interior area 44 and a pair of guide spaces 46 recessed into the cam. A back portion of the latch actuation cam 32 may include a boss 48 or some other mechanism for rotatably mounting the laterally floating latch hub assembly within the FOUP door.

Figure 7:
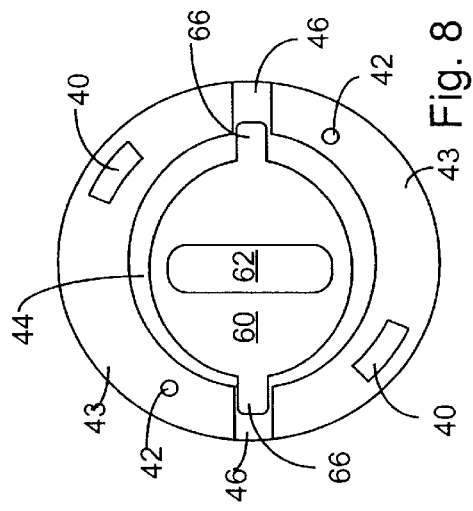
FIG. 7 is a front view of an assembled laterally floating latch hub assembly according to the present invention including a latch key receptor laterally centered within a latch actuation cam.

The latch key receptor 60 includes the slot 62 for receiving the latch key 33, and a pair of wings 66. As best seen in FIGS. 4 and 7, the latch key receptor 60 seats within the recess 44 with wings 66 seating within guide spaces 46.

Figure 8:
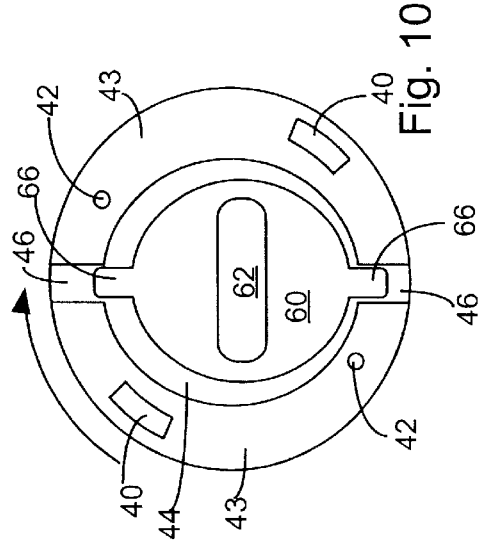
FIG. 8 is a front view of a laterally floating latch hub assembly according to the present invention including a latch key receptor translated to a first side within a latch actuation cam.
Figure 9:
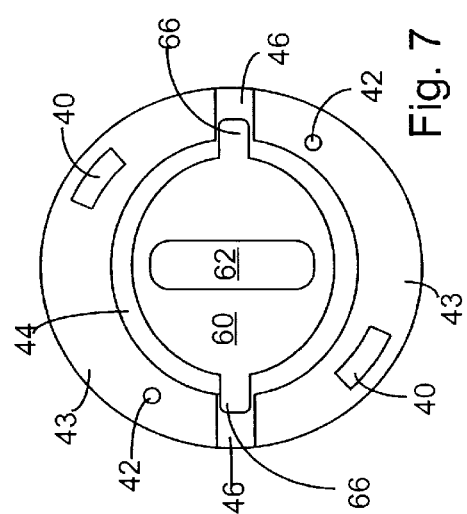
FIG. 9 is a front view of a laterally floating latch hub assembly according to the present invention including a latch key receptor translated to a second side within a latch actuation cam.

With such an arrangement, latch key receptor 60 is free to move laterally side to side within the latch actuation cam as shown in FIGS. 8 and 9. In one embodiment of the invention, it may move between 10 and 30 mils to either side from a centered position. It is understood, however, that the range of motion of the latch key receptor may be greater or lesser than that in alternative embodiments of the present invention.

In a preferred embodiment, the latch key receptor is held in the recessed area 44 by the FOUP door cover plate 31. The latch actuation cam and latch key receptor are preferably formed of low friction materials so that the latch key receptor may move relatively easily within the recessed area 44 and guide spaces 46. The diameter of the guide spaces 46 are only slightly larger than the diameter of the wings 66 so as to allow relative lateral translation of the latch key receptor within the latch actuation cam, but substantially prevents relative rotation of the latch key receptor relative to the latch actuation cam.

In operation, when the FOUP 20 is advanced to the port door 26, the beveled edges 35 (FIG. 2A) of the latch keys 33 will cause the latch key receptor 60 to slide laterally to the left or right in the event the slot 62 is not directly aligned with the latch key 33 upon FOUP advance. In a preferred embodiment, the slot 62 may additionally include beveled edges 63 to facilitate proper seating of the key 33 in the slot 62 (FIGS. 6C–6D). FIG. 6D illustrates that the beveled edge 63 is sloped. The lateral movement of the receptor 60 ensures that the latch keys properly seat within the floating latch hub assembly 28 according to the present invention even where there is a slight misalignment between the FOUP and the pod door.

Figure 10:
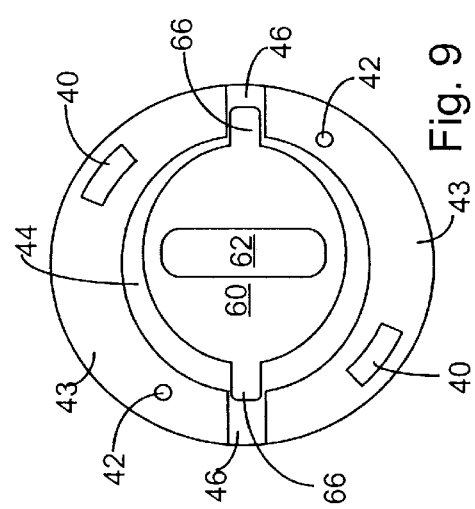
FIG. 10 is a front view of a laterally floating latch hub assembly according to the present invention including a latch key receptor translated to a second side within a latch actuation cam and rotated.

Once seated within the slots 62, latch keys 33 rotate to decouple the FOUP door from the FOUP and to couple FOUP door to the port door. In particular, torque from the latch keys is imparted to latch key receptor 60, which in turn imparts the torque to the latch actuation cam as a result of wings 66 acting on the walls of guide space 46 so that the latch key receptor 60 and the latch actuation cam 32 rotate together as shown in FIG. 10. Thus, the system according to the present invention effectively transmits the torque from the latch keys in the port door to the latch assembly in the FOUP door, while at the same time providing a positionally tolerant system which minimizes or avoids FOUP error at port conventionally occurring as a result of latch key and latch assembly misalignment. Upon rotation as shown in FIG. 10, the latch key is locked within the slot 62 by the cover plate 31.

FIGS. 11A–15 illustrate alternative embodiments of the laterally floating latch hub assembly 28 according to the present invention. Like reference numerals to components described above indicate like structure and operation.

FIGS. 11A and 11B illustrate an embodiment including a latch actuation hub 70 including raised semicircular sections 71. Raised semicircular sections 71 are similar to previously described semicircular walls 43 but do not extend to the outer perimeter of the cam 70. However, as with walls 43, sections 71 define a recessed section 44 and guide spaces 46 for receiving the latch key receptor 60 as shown in FIG. 11B.

Figure 12B:
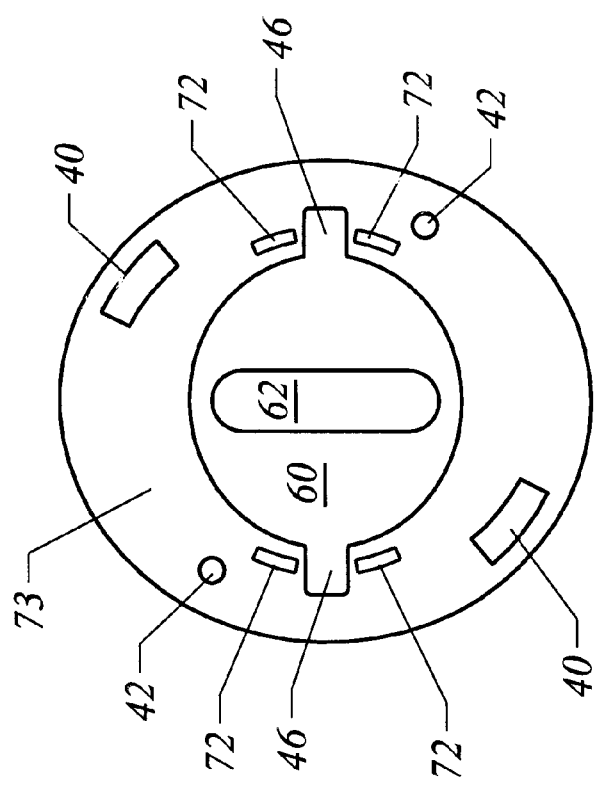
FIG. 12B is a front view of a latch key receptor mounted in the latch actuation cam of FIG. 12A.
Figure 12A:
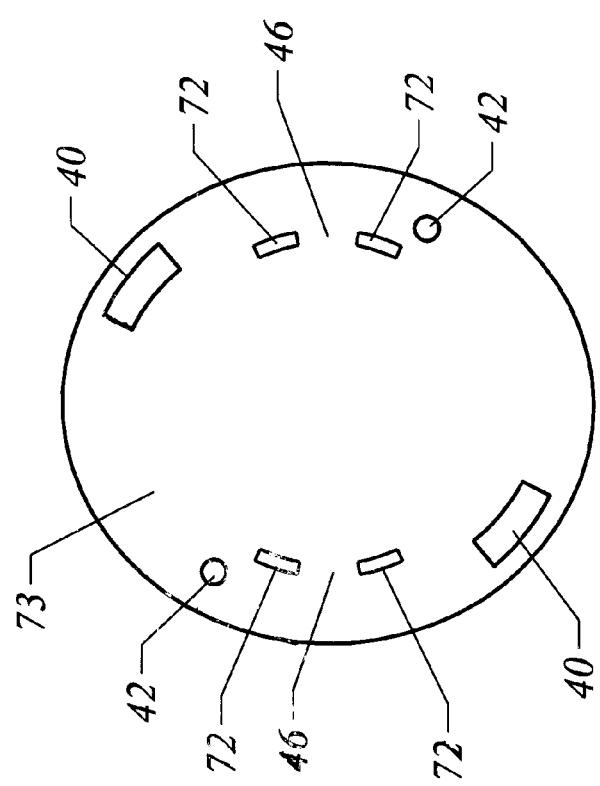
FIG. 12A is a front view of a latch actuation cam according to a further embodiment of the present invention.

FIGS. 12A and 12B illustrate a further embodiment of the present invention, where semicircular sections 71 are reduced simply to raised strips 72 fixedly mounted to a latch actuation cam 73. As shown in FIG. 12B, each pair of raised strips 72 define a guide space 46 therebetween for receiving the wings 66, thus allowing latch key receptor 60 to translate laterally on latch actuation cam 73. The raised strips 72 prevent relative rotation between the receptor 60 and cam 73. Instead, cam 73 rotates with receptor 60 upon actuation of the receptor 60 by keys 33.

Figure 13A:
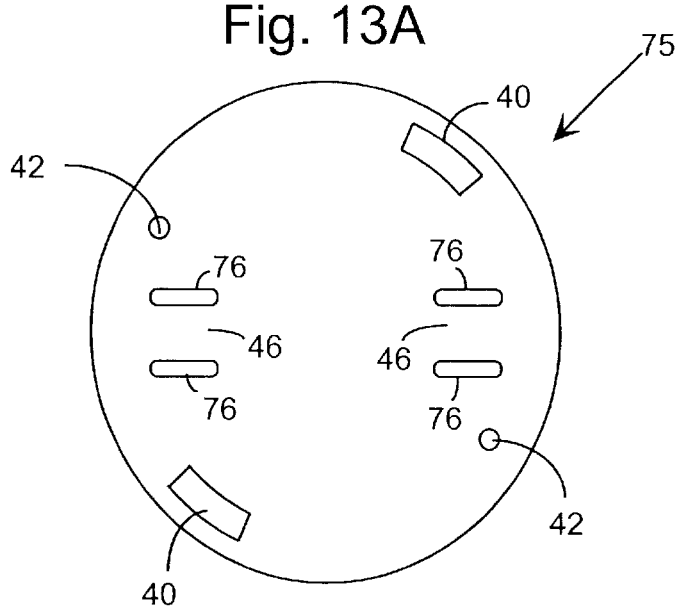
FIG. 13A is a front view of a latch actuation cam according to an alternative embodiment of the present invention.
Figure 13B:
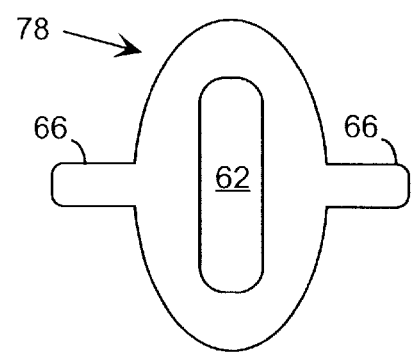
FIG. 13B is a front view of a latch key receptor according to an alternative embodiment of the present invention.
Figure 13C:
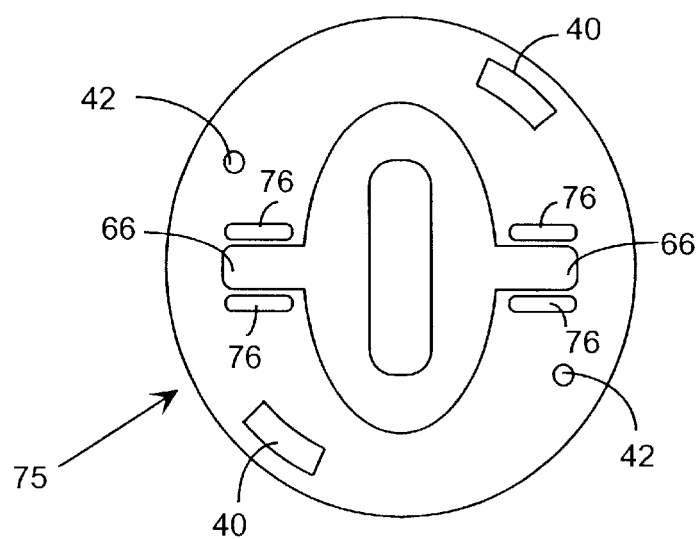
FIG. 13C is a front view of a laterally floating latch hub assembly including the latch actuation cam of FIG. 13A and the latch key receptor of FIG. 13B.

A further alternative embodiment of the laterally floating latch hub assembly 28 is shown in FIGS. 13A–13C. This embodiment includes a latch actuation cam 75 having two pair of parallel raised guides 76, with each pair defining the guide space 46 therebetween as shown in FIG. 13A. FIG. 13B shows a latch key receptor 78 including wings 66 and a slot 62 as described above. As shown in FIG. 13C, receptor 78 is capable of lateral translation within the guide spaces 46 defined by the two pair of guides 76, and the wings 46 act on the guides so that the cam 75 rotates with the receptor 78.

Figure 14A:
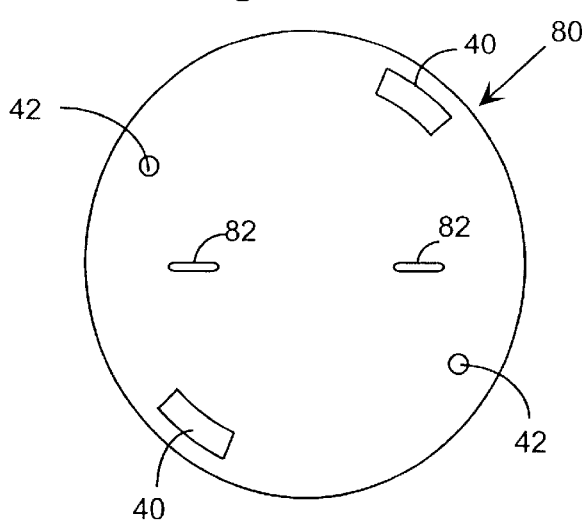
FIG. 14A is a front view of a latch actuation cam according to a further alternative embodiment of the present invention.
Figure 14B:
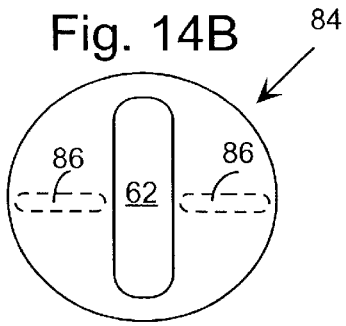
FIG. 14B is a front view of a latch key receptor according to a further alternative embodiment of the present invention.
Figure 14C:
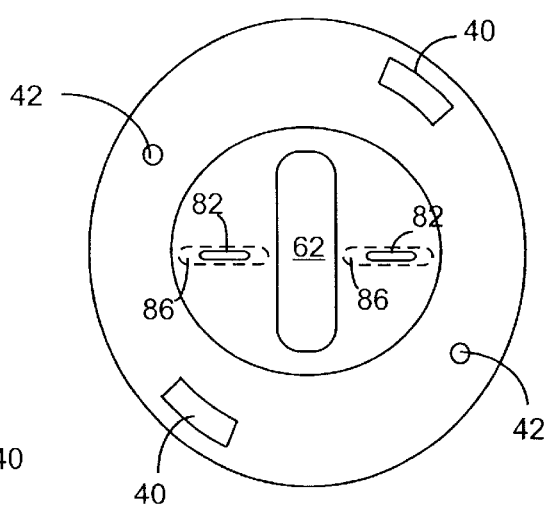
FIG. 14C is a front view of a laterally floating latch hub assembly including the latch actuation cam of FIG. 14A and the latch key receptor of FIG. 14B.

FIGS. 14A–14C illustrate a further alternative embodiment of the laterally floating latch hub assembly 28. This embodiment includes a latch actuation cam 80 including a pair of laterally spaced raised guides 82. This embodiment further includes a latch key receptor 84 including a slot 62 and a pair of oblong recesses 86 in the back side of the receptor 84. In operation, as shown in FIG. 14C, the latch key receptor 84 fits on the latch actuation cam 80 so that the oblong recesses 86 fit over the raised guides 82. The guides 82 have a shorter length than the recesses 86 so that the receptor can float laterally over the guides, but the width of the guides is only slightly less than the width of the recesses so that any rotation of the receptor 84 is imparted to the cam 80. It is understood that the relative positions of the guides 82 and recesses 86 on the receptor and cam may be switched in alternative embodiments.

A number of embodiments of the laterally floating latch hub assembly have been disclosed herein. However, those of skill in the art will appreciate that a wide variety of other configurations may be provided for constraining a latch key receptor to laterally float within a latch actuation cam while effectively transmitting the torque from the latch keys in the port door to the latch assembly in the FOUP door.

Figure 15:
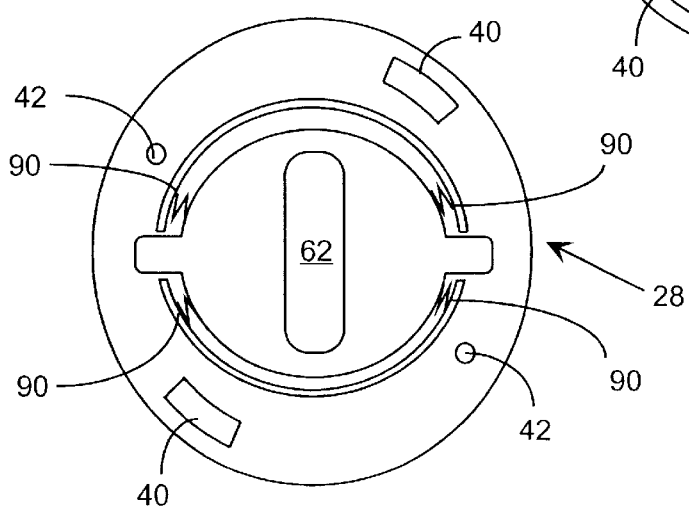
FIG. 15 is an embodiment of the laterally floating latch hub assembly including a side to side centering spring.

Up to this point, the latch key receptor has been described as freely floating in the lateral direction within the latch actuation cam. In a further alternative embodiment of the present invention, the latch key receptor may be biased to a home position, such as for example centered within the latch actuation cam. One such embodiment is shown in FIG. 15. In this embodiment, a latch key receptor 60 is biased to a center position within a latch actuation cam 70 by a pair of springs 90 mounted between sections 71 and the receptor 60. The springs allow the receptor to move laterally upon engagement with the latch key 33, but returns the receptor back to the home position centered within the latch actuation cam when the latch key is removed from the receptor. It is understood that a biasing mechanism such as a spring may be used with any of the above-described embodiments. As would be appreciated by those of skill in the art, a variety of other biasing mechanisms may be provided to bias the receptor to a home position within the latch actuation cam.

Up to this point, the laterally floating assembly has been described as part of the latch assembly in the FOUP. However, in addition or as an alternative to that assembly, the present invention contemplates that the latch keys 33 may also be mounted for lateral movement. In such an embodiment, a latch key may be mounted for lateral movement on a driven hub that is in turn rotationally mounted in the port door and driven to rotate by a motor behind or remote from the port door. In accordance with this embodiment, the latch keys 33 may include components such as wings 66 described above for riding in a guide space as described above formed on the driven hub. Thus, the latch keys 33 can translate laterally to ensure a proper fit of the keys within the latch assembly, while also ensuring that the torque from the driven hub is transmitted through the latch keys to the latch assembly in the FOUP.

Although the invention has been described in detail herein, it should be understood that the invention is not limited to the embodiments herein disclosed. Various changes, substitutions and modifications can be made thereto by those skilled in the art without departing from the spirit or scope of the invention.

What is claimed is:

1. A latch assembly located in a carrier door for coupling the carrier door to a carrier shell, the latch assembly comprising:

a rotational element mounted to said carrier door defining a rotational axis, said rotational element having a center portion partially surrounded by a pair of raised guides; and a latch key receptor seated on said rotational element, said latch key receptor having a body portion with an outside diameter smaller than said center portion so that there is a gap located between said outside diameter and said raised guides when said latch key receptor is substantially centered between said raised guides, said body portion having a slot capable of receiving a latch key and a pair of engagement tabs extending therefrom, said latch key receptor is capable of moving in a plane substantially orthogonal to said rotational axis so that said engagement tabs drive said rotational element about said rotational axis; and a pair of latch arms having a proximal end mechanically fastened with said rotational element and a distal end capable of engaging the carrier shell.

2. A latch assembly according to claim 1, wherein said rotational element further comprises a pair of pins extending substantially perpendicular from said rotational element, said pins for driving said pair of latch arms upon rotation of said rotational element.

3. A latch assembly according to claim 1, wherein said rotational element further comprises ramps for pivoting said pair of latch arms upon rotation of said rotational element.

4. A latch assembly for a SMIF container having a container shell and a container door, comprising:

a rotational element rotatably mounted to the container door defining a rotational axis, said rotational element having a body with a pair of recessed guides and a recessed center area;

a latch key receptor capable of receiving a latch key extending into the container door, said latch key receptor having a body seated in said recessed center area and a pair of engagement tabs extending from said body seated in said recessed guides, said latch key receptor capable of moving in a plane substantially orthogonal to said rotational axis; and a pair of latch arms having a proximal end engaged with said rotational element and a distal end capable of engaging the container shell.

5. A latch assembly according to claim 4, further comprising a detenting mechanism for compliantly retaining said latch key receptor centered in said recessed area.

6. A latch assembly according to claim 4, wherein said latch key receptor has a central opening with beveled edges adapted to facilitate proper seating of a latch key extending into the container door.

7. A latch assembly for a SMIF container having a container shell and a container door, comprising:

a rotational element rotatably mounted to the container door defining a rotational axis, said rotational element having a body with raised guides extending from said body, said raised guides forming guide spaces;

a latch key receptor seated on said rotational element capable of receiving a latch key extending into the container door, said latch key receptor having a body positioned between said raised guides and a pair of engagement tabs extending from said body seated in said guide spaces, said latch key receptor capable of moving in a plane substantially orthogonal to said rotational axis; and a pair of latch arms having a proximal end engaged with said rotational element and a distal end capable of engaging the container shell.

8. A latch assembly according to claim 7, wherein each pair of raised guides comprises elongated, parallel raised guides.

9. A latch assembly according to claim 7, further comprising a detenting mechanism for compliantly retaining said latch key receptor centered between said raised guides.

10. A latch assembly according to claim 7, wherein said rotational element further comprises pins extending from said body for driving said pair of latch arms upon rotation of said rotational element.

11. A latch assembly according to claim 7, wherein said rotational element further comprises ramps for pivoting said pair of latch arms upon rotation of said rotational element.

12. A latch assembly according to claim 7, further comprising a cover plate holding said pair of engagement tabs engaged with said guide spaces.

13. A latch assembly for a SMIF container having a container shell and a container door, comprising:

a rotational element rotatably mounted to the container door defining a rotational axis, said rotational element having a body with at least one raised guide extending from said body;

a latch key receptor ca able of receiving a latch key extending into the container door and moving in a plane substantially orthogonal to said rotational axis, said latch key receptor having a body with an oblong recess so that said raised guide extends into said oblong recess when said latch key receptor is seated on said rotational element; and a pair of latch arms having a proximal end engaged with said rotational element and a distal end adapted to engage the container shell.

* * * * *